United States Patent
Usuda et al.

[11] Patent Number: 6,066,571
[45] Date of Patent: May 23, 2000

[54] METHOD OF PREPARING SEMICONDUCTOR SURFACE

[75] Inventors: Koji Usuda, Yokohama; Keisaku Yamada, Ebina, both of Japan

[73] Assignee: Kabushiki Kaisha Toshiba, Kawasaki, Japan

[21] Appl. No.: 09/004,612

[22] Filed: Jan. 8, 1998

[30] Foreign Application Priority Data

Jan. 10, 1997 [JP] Japan .................................. 9-013235

[51] Int. Cl.[7] .................................................. H01L 21/302
[52] U.S. Cl. .......................................... 438/745; 438/747
[58] Field of Search ..................................... 438/745, 754, 438/747, 748, 753; 134/1.3, 1.2, 1.1

[56] References Cited

U.S. PATENT DOCUMENTS 4,861,418 8/1989 Nishimura et al. ...................... 117/904
5,587,103 12/1996 Dennis .................................... 252/79.3

OTHER PUBLICATIONS

Y. Morita et al., "Ideal Hydrogen Termination of Si (001) Surface by Wet–Chemical Preparation", Applied Physics Letters, 67 (18) :2654–2656 (1995).

U. Neuwald et al., "Wet Chemical Etching of Si (100) Surfaces in Concentrated $NH_4F$ Solution: Formation of (2x1) H Reconstructed Si (100) Terraces Versus (111) Facetting", Surface Science Letters 296:L8–L13 (1993).

Silicon Processing for the VLSA Era, S. Wolfe, Chapter 1: Single Crystal Growth and Wafer Preparation, pp. 1–7; 23–30; 55–56, 1990.

*Primary Examiner*—Benjamin Utech
*Assistant Examiner*—Duy-Vu Deo
*Attorney, Agent, or Firm*—Finnegan, Henderson, Farabow, Garrett & Dunner, L.L.P.

[57] ABSTRACT

A method of preparing a semiconductor work surface comprises the steps of forming an Si monocrystaline substrate including a semiconductor work surface, removing by wet-etching a silicon oxide film formed on the work surface, using HF solution, and washing the work surface by pure water, serving as a washing liquid, of a dissolved oxygen concentration of 500 ppb or lower. The work surface is made of monocrystal and has an orientation a certain amount off the (001) plane. The certain amount is set such that an axis of the work surface has a component inclined with an angle of from 1° to 5° from the [001] direction to a <010> direction. The washing liquid of pure water has a property of etching the Si monocrystal, such that a single or a plurality of surfaces, including the (111) plane, can be preferentially exposed.

20 Claims, 7 Drawing Sheets

METHOD OF PREPARING SEMICONDUCTOR SURFACE

BACKGROUND OF THE INVENTION

The present invention relates to a method of cleaning and preparing a monocrystalline semiconductor surface to be processed, i.e., the work surface of a semiconductor substrate, and particularly to a method of preparing a semiconductor surface having a surface orientation somewhat off the (001) plane.

Control of the work surface of a semiconductor substrate in the semiconductor process greatly influences the quality of semiconductor devices manufactured thereafter. For example, residual impurities on the work surface, e.g., a natural oxide film, organic contaminant and heavy metal, act as a process inhibiting factor or device performance reducing factor.

As regards an Si monocrystalline substrate, the residual impurities make it difficult to control a thin gate oxide film with high accuracy. Further, the impurities deteriorate electric characteristics such as an insulation breakdown voltage, increase the serial resistance of a metal ohmic contact, and also deteriorate rectification characteristics. Moreover, it is known that the roughness of the work surface, formed in a step of forming a thin gate oxide film, is a factor of device deterioration, such as deterioration in the mobility. Therefore, in the process of manufacturing semiconductor devices, it is indispensable to form a work surface, which can be clean and flat, free from residual impurities. The requirement for cleanness of the work surface is studied in the field of various materials as a common problem not only semiconductor.

In general, to obtain an ideal clean Si monocrystalline surface, an Si monocrystal (an ingot) is sliced, and the sliced surface is polished and chemically etched, thereby forming a mirror surface. A wafer surface immediately after slicing may often include blade marks, in which case surface roughness of from sub-micron to hundreds of microns remains. Further, surface contaminant, mainly consisting of organic substances, metal and oxide film, exists, in addition to the roughness. To remove the contaminant, the wafer is washed first. Thereafter, the wafer is chemically polished to finish the surface to roughness of several nanometers, whereby an Si wafer is obtained. On the Si wafer thus obtained, a natural oxide film is formed. Since the roughness of several nanometers exists on the wafer surface, i.e., between the natural oxide film and the Si wafer, flatness in the atomic order is not realized.

Figure 2:
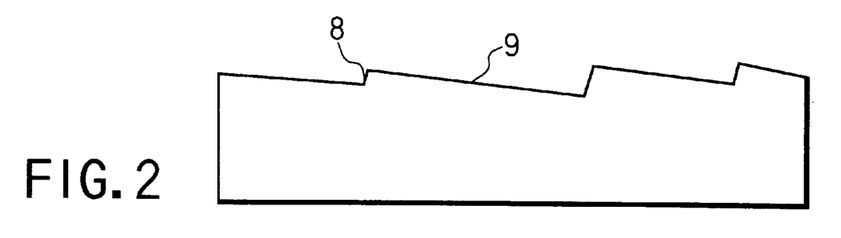
FIG. 2 is a cross-sectional view of a semiconductor surface processed according to a method disclosed in Jpn. Pat. Appln. KOKAI Publication No. 8-264780.

Jpn. Pat. Appln. KOKAI Publication No. 8-264780 discloses a treatment method for obtaining flatness in the atomic order in the Si wafer. In the method disclosed in this publication, after an ingot is sliced into an Si wafer or a natural oxide film is removed from the Si wafer, surface contaminants such as organic substances are removed from the Si wafer. Then, the Si wafer is subjected to a heat treatment at a temperature of 1000° C. or higher in an atmosphere having a hydrogen partial pressure, thereby reconstructing the surface. As a result, a flat wafer surface including a step 8 and a terrace 9 is obtained (see FIG. 2). In other words, according to this method, the washing and high temperature treatment removes the roughness and contaminant generated as a result of slicing and reduces the surface roughness of sub-micron or hundreds of microns. The Si wafer thus produced has a natural oxide film on its surface when the user receives it; however, the wafer surface itself is clean and flat.

However, according to the conventional methods of cleaning a semiconductor work surface, including the method disclosed in the aforementioned publication, the residual impurities on the surface cannot be reduced sufficiently. Hence, deterioration in device performance, which is considered to result from contaminant on the surface, is frequently observed as process dependency. In particular, even if the wafer is cleaned by the above method, once the natural oxide film is removed from the surface during manufacture of semiconductor devices, the flatness of the substrate surface is gradually deteriorated by new contaminant and corrosion, causing deterioration in the device performance.

As a means for solving the above problem, a method of coating the work surface of an Si substrate with an oxide film by RCA washing is proposed (W. Kern, RCA Review, Vol. 31, 1970). In general, when an oxide film is formed on an Si substrate, the residual impurities, which have adhered to the Si substrate before forming an oxide film, are taken into the oxide film. Therefore, if adhesion of residual impurities on the Si substrate surface is suppressed immediately after a step of removing the oxide film subsequent to the step of forming the oxide film, a clean Si substrate can be obtained.

For example, in the case of RCA washing as described above, an oxide film having a thickness of 1 nm is formed on an Si substrate. Then, the Si substrate is introduced in a vacuum chamber which can heat a substrate. In the vacuum device, the Si substrate is heated at a temperature of 800° C. or higher in an ultra-high vacuum of about $10^{-8}$ Pa, in which an Si substrate is not likely contaminated. Thus, the oxide film on the Si substrate can be removed and a clean surface can be obtained. Further, this method is advantageous in that an oxide film can be formed relatively easily, and that the oxide film also serves as a protection film for protecting the interface formed thereunder when the substrate is left in the atmosphere.

However, in a case of processing a substrate of a large diameter of 8 inches or greater, which is considered to come into wide use in the future, the heat treatment step under an ultra-high vacuum may raise problems, such as an increase in size or cost of the manufacturing device. In addition, the complexity of the treatment process may increase the possibility of substrate contamination during the process.

On the other hand, when manufacturing current fine ICs, a sophisticated manufacturing process has become indispensable to form a semiconductor device on another semiconductor device. In such a process, it is necessary to realize a lower-temperature process without the aforementioned high vacuum heat treatment, more specifically, to perform all the process of manufacturing semiconductor devices at a temperature of 800° C. or lower. Thus, as regards cleaning of the substrate, there has been an increasing demand for a process by which a clean Si substrate can be obtained at a low temperature. Nevertheless, no specific means for cleaning an Si surface has been proposed, which satisfies the conditions as described above and may realize the low-temperature process.

Therefore, in a process to which the aforementioned high-temperature treatment method cannot be applied, it is necessary to remove the oxide film by another method immediately before the process. In general, HF solution treatment is employed for this purpose. An Si surface from which the natural oxide film is removed and hydrogen-terminated is by HF solution is comparatively stable in the atmosphere. This is an advantage of the treatment using HF solution.

However, the Si surface after the HF solution treatment is generally subjected to a step of washing the HF solution away by pure water in order to assure safety. It is preferable that the period of time for the washing step using pure water be as short as possible. Since oxygen in the atmosphere is dissolved in pure water to a high concentration in the ppm order, the washed surface is generally oxidized. Therefore, if the surface is washed by pure water for a long period of time, an oxide film is formed again on the surface, which has been cleaned by the HF solution.

On the other hand, it has been found that if oxygen dissolved in pure water is removed, the surface oxidation in the step of washing with pure water is suppressed, as the concentration of the dissolved oxygen is reduced. For example, as disclosed in Japanese Patent Application No. 53614/93, in a step of washing an Si substrate with ultrapure water containing oxygen in a low concentration, etching of the Si substrate with pure water progresses. As a result, in a dissolved oxygen concentration lower than a threshold value, although a part of the surface may be oxidized by a very small amount of oxygen remaining in pure water, it is considered that the surface is always kept clean, since the oxide film is removed together with the Si surface layer by etching.

Further, use of low oxygen concentration ultrapure water realizes direct reaction between pure water and Si on the substrate surface, which has been prevented by the surface oxidation (K. Usuda et al. Appl. Phys. Lett., 64,3240 (1994)). If the reaction is realized, the surface roughness of the Si substrate may increase, as the time period of washing by pure water increases (H. Kanaya et al., Appl. Phys. Lett., 67,683 (1995)).

However, since details of the change in surface roughness has been unknown, the mechanism of etching the Si substrate by pure water has not been clarified. Therefore, it is required to realize a method for reducing roughness based on clarification of the conditions of increasing the surface roughness or the mechanism of etching.

As described above, surface control for achieving both cleaning and flattening semiconductor crystal has been studied as a technique indispensable to form, for example, a semiconductor surface. However, the conventional treatment includes a number of steps, which are complicated, but a satisfactory effect has not been obtained. Therefore, the conventional treatment requires a great amount of chemicals and pure water for cleaning. Under the circumstances, it is necessary to realize a simpler cleaning process to decrease the number of steps and cost, and to conserve global environmental by decreasing the amount of chemicals. It is a problem of the cleaning process, which arises in actual device manufacture, that the residual impurities on the surface cannot be fully removed after the process and the surface may become less flat.

BRIEF SUMMARY OF THE INVENTION

The present invention has been made in consideration of the above matters, and its object is to provide a method of preparing a semiconductor surface at a low cost and high performance, by easily and safely maintaining the cleanness and flatness of the surface of a monocrystalline substrate. In other words, an object of the present invention is to provide a method of preparing a semiconductor surface to be processed, which can be applied to a preprocess before manufacturing semiconductor devices using a wafer on the market, in which the surface flatness in the nanometer order and the surface cleanness can be maintained more satisfactorily as compared to the conventional method, and which can be performed at a lower cost and high performance.

The present invention has been made in consideration of the above matters. According to the present invention, there is provided a method of preparing a semiconductor work surface, comprising:

a forming step of forming a substrate having a semiconductor work surface which is designed to be made of a monocrystal and to have an orientation off a (001) plane by a certain amount set such that an axis of the work surface has a component inclined with a first angle of from 1° to 5° from a [001] direction to a <010> direction;

an etching step of etching and removing an oxide film, formed on the work surface after the forming step, by an etchant; and a washing step of washing the work surface by a washing liquid having a property of etching the monocrystal, after the etching step.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The file of this patent contains at least one drawing executed in color. Copies of this patent with color drawings will be provided by the Patent and Trademark Office upon request and payment of the necessary fee.

DETAILED DESCRIPTION OF THE INVENTION

FIGS. 1A to 1D are cross-sectional views showing, in sequence, steps of a method of preparing a semiconductor surface processed according to an embodiment of the present invention. In the following, preparation of a semiconductor work surface according to the embodiment of the present invention will be described, referring to an Si substrate as an example.

Figure 1A:
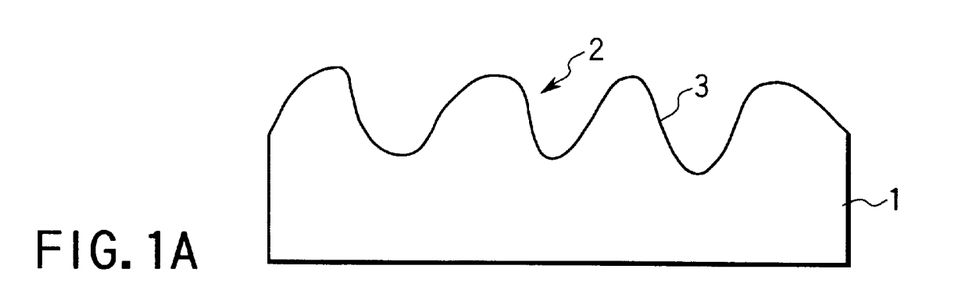
FIGS. 1A, 1B, 1C and 1D are cross-sectional views showing, in sequence, steps of a method of preparing a semiconductor surface to be processed according to an embodiment of the present invention.

First, a substrate 1 made of an Si monocrystal is formed to have a semiconductor work surface 2, which has been designed to have the specific orientations as will be described later (FIG. 1A). The surface 2 is obtained by, for example, slicing the Si monocrystal (an ingot) and polishing and chemically etching the sliced surface to form a mirror surface. Immediately after the slicing, the surface 2 may often include blade marks, in which case surface roughness 3 of sub-micron or hundreds of microns remains. Surface contaminant, mainly consisting of organic substances, metal and oxide film, exists, in addition to the roughness.

Figure 1B:
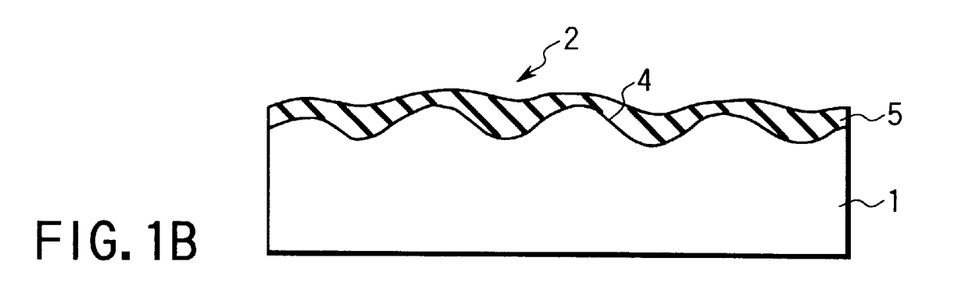

Then, the surface 2 is washed and chemically polished, thereby forming a finished surface having roughness 4 of several nanometers. The surface 2, after this finishing treatment, is covered by a silicon oxide film 5, called a natural oxide film (FIG. 1B). In the finishing step, the surface 2 may be subjected to the RCA washing as described above, so that the silicon oxide film 5 can positively serve as a protection film for protecting the surface 2. In general, semiconductor wafers thus covered by the oxide film are provided for users.

Figure 1C:
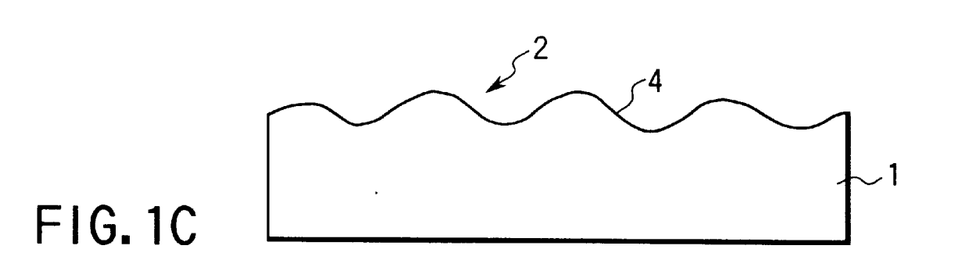

To subject the surface 2 covered by the oxide film 5 to a desired semiconductor process for manufacturing semiconductor devices, it is necessary to remove the oxide film 5. Generally, the oxide film on the surface of a semiconductor wafer after, for example, RCA washing, is removed by heating in a vacuum. However, according to the present invention, the oxide film 5 is etched by etchant without a heating process (FIG. 1C). At this time, HF solution can be used as etchant to wet-wash the surface 2.

Figure 1D:
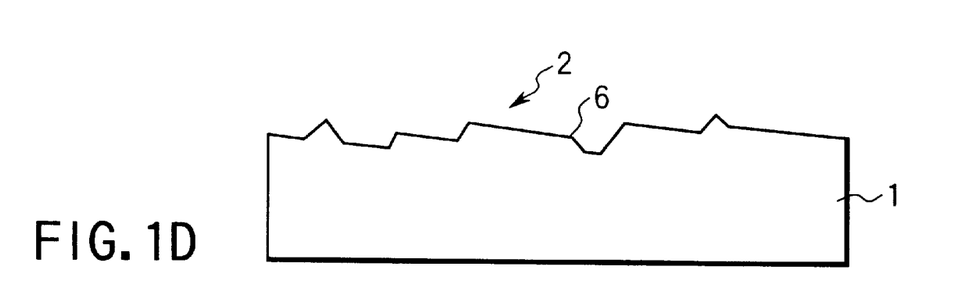

The surface 2, from which the oxide film has been removed, is washed by washing liquid, for example, pure water, thereby finishing the surface 2. Where the washing liquid has a property of etching the surface 2, the washing process is equivalent to etching of the substrate by the washing liquid, with the result that the configuration of the surface 2 is changed by washing, roughness 6 different from the aforementioned roughness 4 is formed (FIG. 1D). The relationship between the orientations of the surface 2 and washing will be described below.

It is known that an Si surface is selectively etched in washing of an Si (111) substrate, so that a flat terrace in the atomic order is exposed (e.g., K. Usuda et al., Appl. Phys. Lett., 64,3240 (1994)). However, the conditions are different in Si (001) substrates used in most of the semiconductor devices of today. For example, it is reported that results of AFM (Atomic Force Microscope) measurement show an increase in the surface roughness in accordance with an increase in period of time of pure-water washing (K. Usuda et al., ECS fall meeting, Ext. abstracts, p 700 (1995)). Further, results of FT-IR (Fourier transform infrared) measurement suggest that the (111) plane is exposed as the period of time of pure-water washing increases (H. Kanaya et al., Appl. Phys. Lett., 67,683 (1995)).

On the other hand, as regards washing with HF solution, the following is reported. When an Si (001) substrate is ridded of a natural oxide film thereon and washed by HF series solution, the surface roughness increases with progress of the solution treatment. Results of measurement of mobility in an MOS device formed on the Si (001) substrate show that the mobility is lowered as the roughness increases (T. Ohmi et al., IEEE, Electron Dev. Lett., 12,652 (1991)).

As described above, it is clear that the solution treatment or pure-water washing to remove the oxide. film increases the roughness of the surface of the substrate. Therefore, it is necessary to avoid solution treatment for a long period of time, more than the period absolutely required to obtain a washing effect.

However, in spite of the problems indicated above, details of the reaction between the surface and the washing liquid (particularly, pure water) in solution washing has not been clarified. One of the reasons is that observation of an Si (001) substrate surface itself has not been possible. For this reason, detailed conditions of even the surface roughness, not only the etching mechanism, have not been clarified.

The present inventors have discovered that when the oxide film on an Si (001) substrate surface is removed by HF solution and subsequently the surface is washed by pure water of a low dissolved oxygen concentration of 5 ppb, the surface can be observed in the nanometer order by means of an STM (Scanning Tunneling Microscope). The observation is achieved as a result of the fact that the surface oxidation is suppressed by reducing the dissolved oxygen concentration in pure water, thereby maintaining direct reaction between pure water and the Si substrate surface.

Figure 4:
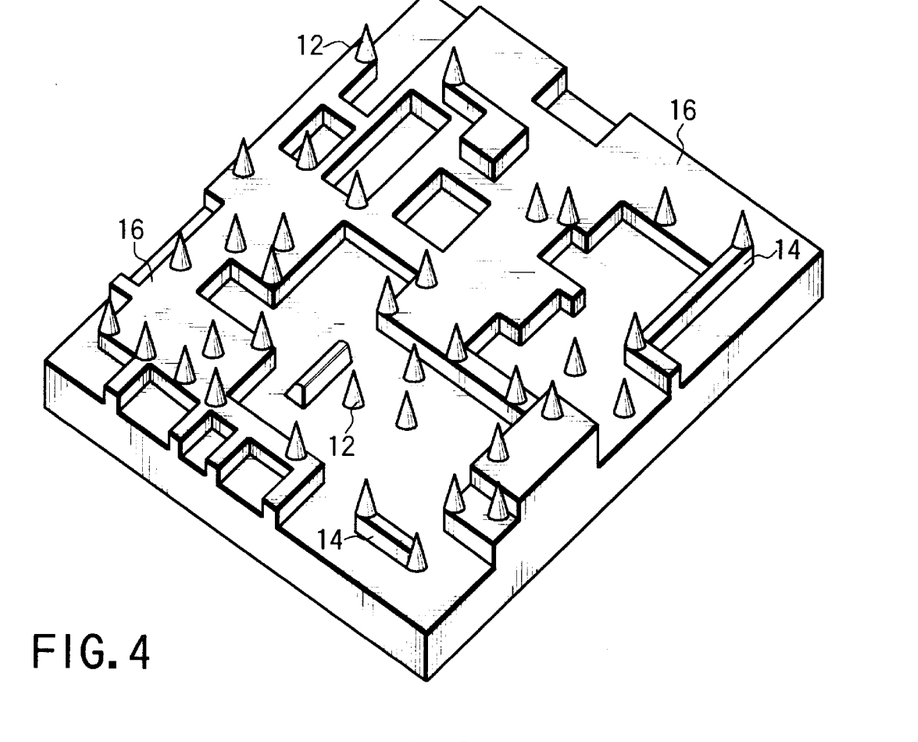
FIG. 4 is a diagram schematically showing an STM (scanning tunneling microscope) image of the work surface of the (001) plane on an Si substrate processed by the conventional method.

FIG. 4 shows an example of the Si surface washed by the conventional method, which had not been clarified before and was first observed by the aforementioned observation method. More specifically, FIG. 4 is a schematic diagram of an STM image of the Si surface of the (001) plane, after solution washing of the conventional method, observed at a resolution in the nanometer order.

As shown in FIG. 4, on the work surface (001) to be processed, there are dot-like projections 12 having a width and height in the nanometer order (e.g., about 1 nm), linear projections 14 having a width and height in the nanometer order (e.g., about 1 nm) along <110> directions, and flat portions 16, which seem to be surrounded mainly by the projections 14, having a width in the nanometer order (e.g., 30 to 200 nm). In general, the dot-like projections 12 are the highest of all the three portions 12, 14 and 16. The linear projection 14 may extend for several tens of nanometers.

Through the observation, it has been discovered, for the first time, that the etching progressed preferentially in <110> directions on the (001) plane, and anisotropic etching is performed to reveal the (111) plane preferentially. The linear projections 14, extending in <110> directions, are parallel to the [110] or [1-10] direction, and perpendicular to each other. It has also been discovered, for the first time, that when the OFF angle from the (001) plane to be processed is as small as 0.5° or less, the linear projections exist uniformly in the [110] and [1-10] directions.

Figure 5:
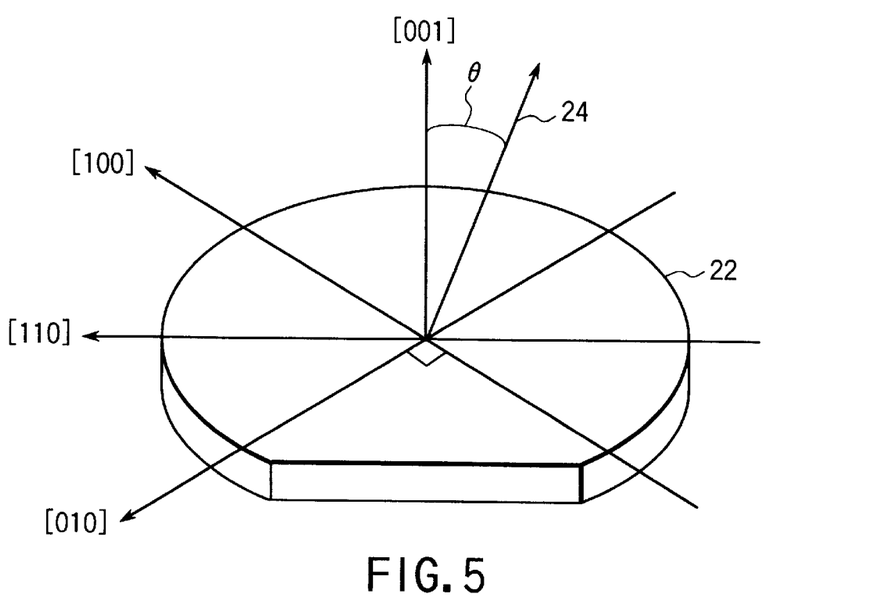
FIG. 5 is a diagram showing orientations of crystal for explaining the present invention.

FIG. 5 is a diagram showing orientations of crystal for explaining the present invention. It is assumed that the direction of an axis 24 of a semiconductor work surface (substrate surface) 22 inclined from the [001] direction (i.e., the direction of the axis of the (001) plane) is an OFF direction, and that an angle formed by the [001] direction axis and the axis 24 (perpendicular to the substrate surface) is an OFF angle θ.

In the case of an Si (001) substrate, a <110> direction or a <010> direction can be selected as the OFF direction, in view of the crystal structure. Based on the discovery through the aforementioned observation, the present inventors paid particular attention to the possibility of preferential exposure of the (111) plane as a result of anisotropic etching. The present invention controls anisotropic etching in a <110> direction, which is considered to be caused by the exposure of the (111) plane, by intentionally controlling the OFF direction and the OFF angle, and therefore controls appearance of projections 12 and 14 and flat portions 16 on the work surface.

In a case where the [110] direction is the OFF direction, the (111) plane in question is maintained. Therefore, it is expected that the etching mechanism is not greatly changed and the conditions of roughness are changed little. In particular, since the OFF angle of the Si (001) substrate used as a substrate for forming semiconductor devices, such as LSIs, is normally 10° or less, it is considered that the etching mechanism and the conditions of roughness will not be greatly changed, even if the axis of the substrate surface is off in the [110] direction within the range of 10° or less.

On the other hand, in a case where the [010] direction is the OFF direction, it is considered that the anisotropic etching preferentially performed in <110> directions, i.e., the preferential exposure of the (111) plane by etching, is prevented. Thus, the appearance of projections 12 and 14 and flat portions 16 can be controlled by conditions of setting the OFF direction and OFF angle.

As described above, according to the present invention, the crystal surface formed by etching is controlled by adjusting the OFF direction and OFF angle of the substrate surface to be processed. Although the control of exposure of the (111) plane is described as the basics, it may be necessary to consider other effects, depending on the structure. For example, in the case of the (001) plane of Si, the flat portions 16 having the flat surface of the (001) plane in the nanometer order increase and decrease in accordance with increase and decrease of the dot-like and linear projections 12 and 14. Therefore, the preferential exposure of the (001) plane can be accelerated by adjusting the OFF direction and OFF angle of the work surface.

The method of preparing a semiconductor work surface to be processed, based on the above aspect of the present invention, comprises: a forming step of forming a substrate having a semiconductor work surface having a predetermined orientation; an etching step of etching an removing an oxide film, formed on the work surface after the forming step, by a predetermined etchant; and a washing step of washing the work surface by a predetermined washing liquid after the etching step.

The work surface is made of a monocrystal and has an orientation off the (001) plane by a predetermined amount. The amount is set such that the axis of the work surface has a component inclined with a first angle of 1° to 5° from the [001] direction to a <010> direction.

The washing liquid has a property of etching the monocrystal. The present invention is particularly effective in a case where the washing liquid has a property of etching the monocrystal, so that a single or a plurality of surfaces, including the (111) plane, can be preferentially exposed.

In other words, the work surface is formed of a monocrystal and has an orientation axis in a first direction. The first direction has a vector component which is projected on the (100) or (010) plane and makes a first angle of 1° to 5° with respect to the [001] direction.

In still other words, the work surface is formed of a monocrystal and has an orientation axis in a $<x_1y_1z_1>$ direction. A $<0y_1z_1>$ or $<x_10z_1>$ direction makes a first angle of 1° to 5° with respect to the [001] direction.

The first angle, i.e., the angle of inclination of the axis of the substrate surface, from the [001] direction to a <010> direction, is preferably set within a range of 2° to 4°. The range of the first angle of 1° to 5°, preferably 2° to 4°, will be described later with reference to FIG. 3 and the like, which show experiment results.

The axis of the substrate surface is not necessarily inclined only in the <010> direction. For example, the axis of the surface may be set to have a component inclined with a second angle of 0° to 80° from the [001] direction to a <010> direction. It is preferable that the range of the second angle be 0.1° to 10°.

The orientation of the substrate surface can be set so that one or both of the density and the size of projections of the nanometer order, which are exposed on the surface after the washing step, are decreased as compared to the case in which the (001) plane of the monocrystal is washed by the washing liquid. For example, the projection is a linear projection extending along a <110> direction.

In the washing step, a number of linear projections (corresponding to the linear projections 14 in FIG. 4) having a height of nm order can be formed on the substrate surface. 60% or more of the linear projections extend parallel to a pair of two directions, the [110] and [-110] directions or the [110] and [1-10] directions, which are closer to the direction to which the axis of the surface is inclined from the [001] direction.

The monocrystal is not limited to a face-centered cubic crystal such as Si. Also in a case where the monocrystal is a body-centered cubic crystal, rhombic crystal or hexagonal crystal, the same effect as that in the case of a face-centered cubic crystal can be expected. For example, the monocrystal may be composed of one element or a combination of a plurality of elements selected from the group consisting of Si, Ge, C, B, N, Ga, As, In, P and Al.

The work surface is not necessarily a surface of a wafer obtained by slicing an ingot. For example, the work surface may be an upper surface of a monocrystalline layer epitaxially grown on the substrate. Alternatively, it may be a side or bottom surface of a trench formed in a substrate by RIE (Reactive Ion Etching) or CDE (Chemical Dry Etching).

The oxide film covering the work surface is a all natural oxide film or an oxide film positively formed as a protection film for protecting the surface. Various materials can be used as an etchant for removing the oxide film. A typical material is a compound etching solution containing fluorine atoms and hydrogen atoms, for example, HF solution.

A preferable example of the washing liquid for cleaning semiconductor, e.g., Si, is pure water. In particular, if pure water having a dissolved oxygen concentration of 500 ppb or lower is used, a cleaner substrate surface can be obtained, without oxidation due to oxygen in pure water. In this case, pure water of a low dissolved oxygen concentration can be produced in advance and supplied to the surface for washing. Alternatively, the dissolved oxygen concentration can be reduced immediately before cleaning in a nitrogenous atmosphere. If the dissolved oxygen concentration of pure water is high, an oxide film will probably be formed on the substrate to be processed. Instead of pure water, a $NH_4F$ solution of a concentration of several tens percent can be used as a washing liquid for washing Si. In this case, the etching speed can be two digits higher than that in the case of using pure water.

Further, the washing liquid may contain various acids or alkalis. Therefore, the washing liquid may be composed of one substance or a combination of a plurality of substances selected from the group consisting of pure water, $NH_4OH$, $NH_4F$, HF, HBr, HCl, $H_2O_2$, $H_2SO_4$, $HNO_3$, $O_3$ and a surfactant. In the washing step, the temperature of the washing liquid is set at from 0° C. to 200° C., preferably from 15° C. to 30° C., and the period of time in which the work surface is in contact with the washing liquid is set at from one second to a hundred hours, preferably from one second to sixty minutes.

With the above structure, according to the method of preparing a semiconductor surface to be processed of the present invention, projections in the nanometer order can be increased and decreased suitably. Therefore, the process can be simplified and the amount of chemicals used in the process can be reduced. In contrast, according to the conventional art, an oxide film is formed by use of chemicals to assure flatness, and the interface between the oxide film and the substrate, obtained by the subsequent washing step, is used as a work surface.

As described above, the method according to the present invention, safety in the process can be maintained, the amount of chemicals used in the process can be reduced, and the process can be simplified. Further, the present invention can be applied to finish the Si surface in the washing step.

In the washing step, the washing liquid may be exposed to the atmosphere as in the conventional processing chamber, so that oxygen or the like in the atmosphere can be taken into the washing liquid as dissolved gas. In this case, however, the effect of the present invention can be obtained only before the overall oxidation of the Si surface is completed by gas contributing to oxidation or solution containing oxidizing agent.

EXPERIMENT

An experiment using an Si monocrystalline substrate will be described.

Figure 3:
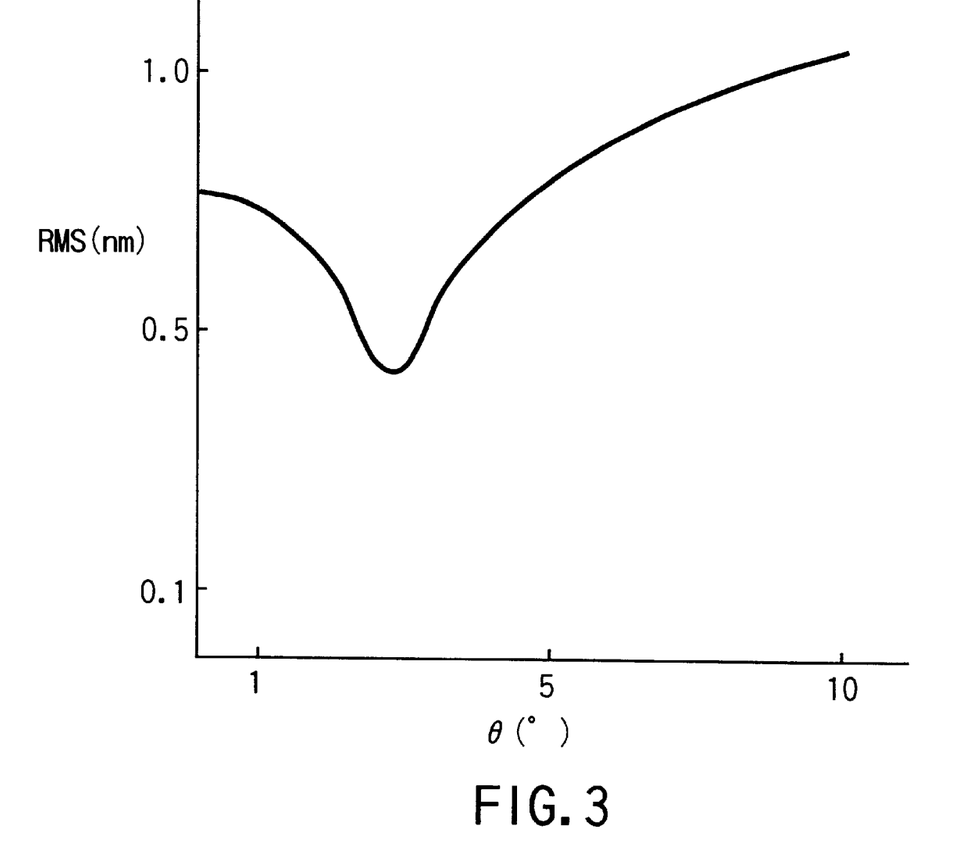
FIG. 3 is a graph showing the relationship between an OFF angle θ of the inclination of an axis of the work surface of an Si (001) substrate from the direction [001] to a direction <010> and a root mean square (RMS), i.e., an index of roughness of the work surface which has been washed by ultrapure water.

FIG. 3 is a graph showing the relationship between an OFF angle θ of the inclination of an axis of the work surface of an Si (001) substrate from the direction [001] to a direction <010> and a root mean square (RMS), i.e., an index of roughness of the work surface which has been washed by ultrapure water. As shown in the graph, the RMS decreases greatly in a range of the Off angle between 1° and 5°, particularly, 2° and 4°, with a minimum peak value at the OFF angle θ of about 3°.

Figure 6:
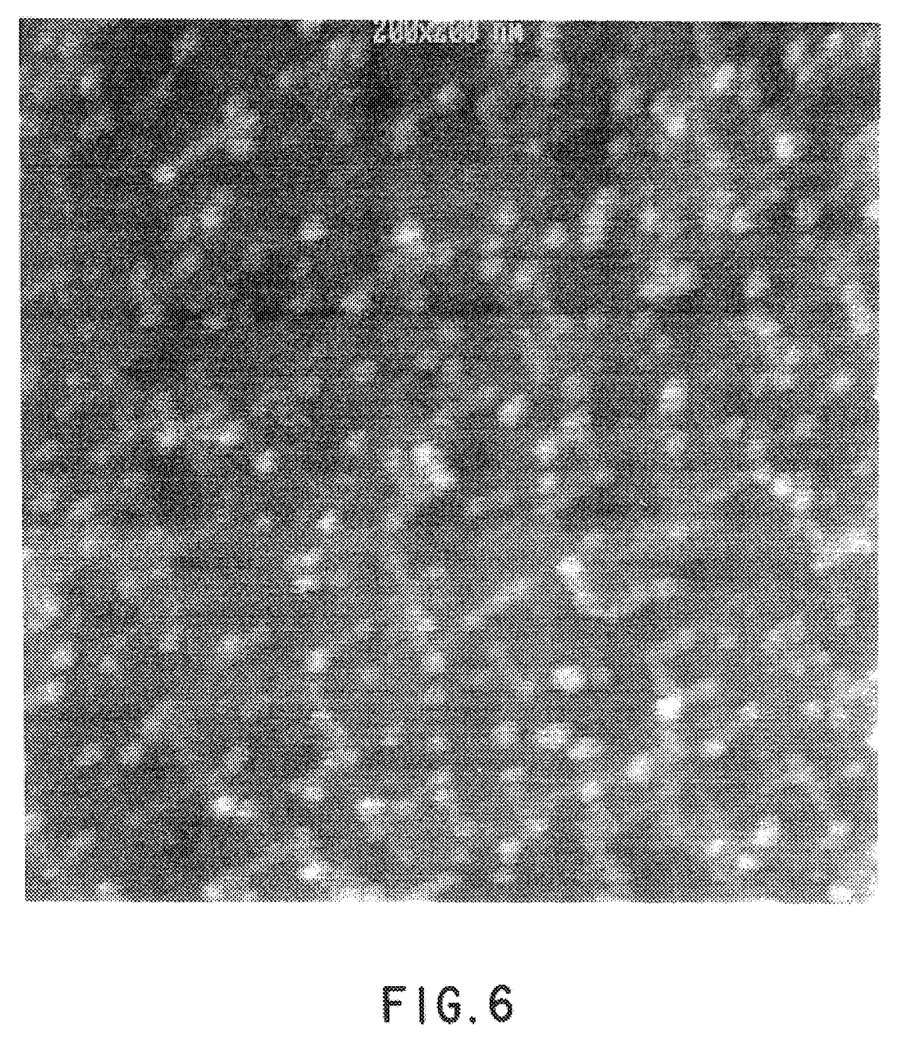
FIG. 6 is an STM photograph image of a surface of an Si substrate of Sample 1 processed by a conventional washing method.

FIG. 6 is an STM photograph image of a surface of an Si substrate of Sample 1 processed by a conventional washing method. A p-type CZ-Si (001) substrate of resistivity of 1–5Ω·cm was used as a substrate of Sample 1. The OFF angle of the (001) plane to be processed was "just" (±0.5° or less).

In the step of cleaning Sample 1, the substrate was first immersed in HF solution, and the natural oxide film was removed. Then, the substrate was rinsed continuously for 5 hours in pure water of a dissolved oxygen concentration of 5 ppb, so that the substrate would not be in contact with the atmosphere. Thereafter, the substrate was taken out of the pure water into the atmosphere and transferred to an UHV-STM, with which the work surface was observed at room temperature. It is preferable that the substrate be transferred not through the atmosphere in the actual process of manufacturing semiconductor devices or the like, for the purpose of reducing the contaminant from the atmosphere. However, an image required for observation in the experiment can be obtained, even if the substrate is transferred in the atmosphere.

As clear from the image shown in FIG. 6, projections having a height and width in the nanometer order, as indicated by random white contrast, are formed on the substrate surface of Sample 1. It was discovered that the size of the projections increased as the period of rinse time increased, and that the density of the projection increased in accordance with the period of rinse time of 20 hours or shorter. It is considered that the surface roughness increases, as the density and size of the projections increase.

The same substrate was observed with an AFM in the atmosphere. In this case, it was confirmed that the roughness increased as the period of rinse time increased. However, the resolution was not high enough to explain the results of FT-IR measurement. In other words, the STM image shown in FIG. 6 was photographed with a high resolution which cannot be obtained in the prior art. The image was first obtained by observing the substrate to be processed in the vacuum, after the substrate was washed by pure water having a fully-reduced dissolved oxygen concentration.

It is considered that a projection having a height and width in the nanometer order appears mainly with the (111) plane. However, it has been discovered that the angle formed between the inclined surface of the projection and the (001) plane is often smaller than the angle formed between the (111) plane and the (110) plane. This fact proves that the inclined surface formed by etching is not necessarily formed of only the (111) plane, i.e., that it may be formed of one or a combination of two or more of the (111), (110) and (001) planes. Although details of the surfaces of the projection will not be clarified until the surface evaluation in the atomic order is realized, it is clear from the observation results of this experiment that the projection is anisotropic, having a longitudinal axis extending in a direction substantially parallel to <110> directions.

Figure 7:
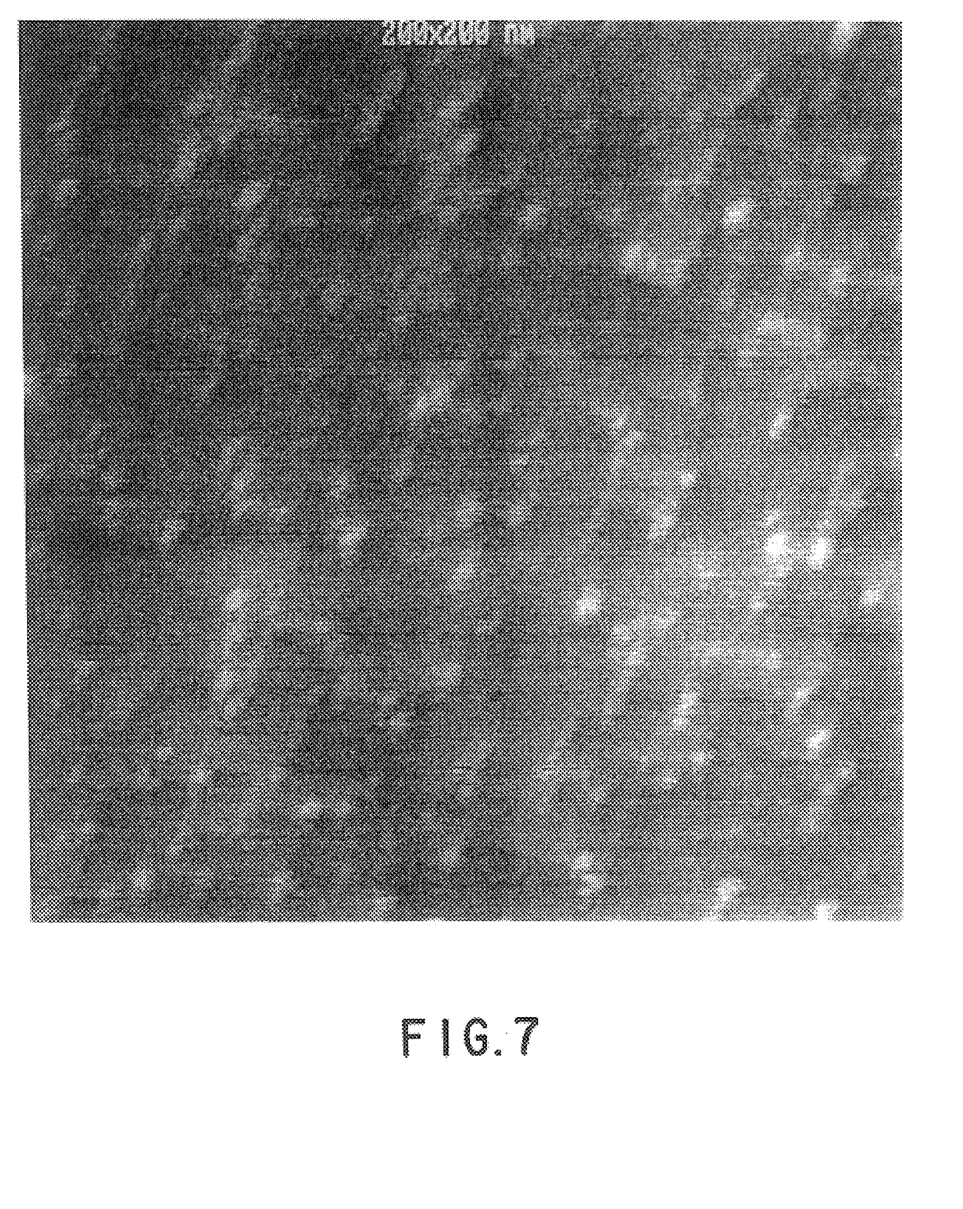
FIG. 7 is an STM photograph image of a surface of an Si substrate of Sample 2 processed by a washing method according to the present invention.
Figure 8:
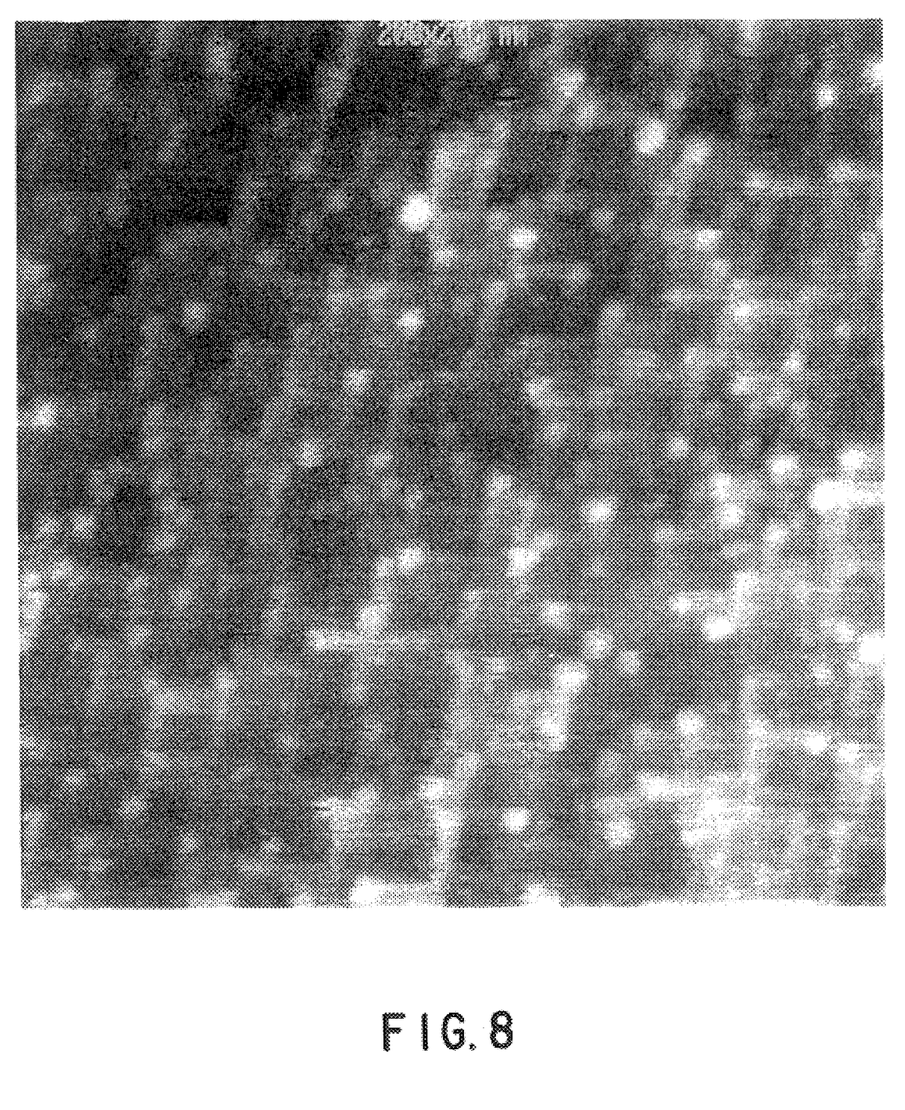
FIG. 8 is an STM photograph image of a surface of an Si substrate of Sample 3 processed by a washing method according to the present invention.

FIGS. 7 and 8 are STM photograph images of a surface of an Si substrate of Samples 2 and 3 processed by the washing method according to the present invention. In the substrate of Sample 2 shown in FIG. 7, the work surface was inclined 3° from the [001] direction only to a <010> direction. In the substrate of Sample 3 shown in FIG. 8, the work surface was inclined 5° from the [001] direction only to a <010> direction. The substrates of Samples 2 and 3 were the same in the other respects.

Samples 2 and 3 were washed under the same conditions as those in Sample 1 and observed by an STM. As shown in the photograph images of FIGS. 7 and 8, the projections extending substantially uniformly in <110> directions, i.e., the [110], [–110], [–1-10] and [1-10] directions, were decreased in Samples 2 and 3, and the probability of appearance was not uniform. In the experiment, projections in the nanometer order, having a longitudinal axis in the four equivalent <110> directions, were formed non-uniformly on the substrate for the first time. Thus, it becomes clear through the experiment that the object of the present invention can be achieved by using a substrate which satisfies the above conditions and a suitable washing method.

Further, in Samples 2 and 3, there were a number of fine linear projections, having a height of nm order, on the substrate to be processed. 60% or more of the linear projections extended parallel to a pair of two directions, the [110] and [–110] directions or the [110] and [1-10] directions, which were closer to the direction to which the axis of the surface was inclined from the [001] direction.

The density of the projections in the nm order was particularly lower in Sample 2 than those in Sample 1. Further, as shown in FIG. 3, the root mean square (RMS), i.e., an index of roughness of the work surface, was changed from 0.44 nm, 0.70 nm to 0.94 nm, as the OFF angle of the substrate was increased from 3°, 5° to 10°. In other words, when the OFF angle was changed from 3°, 5° to 10°, the roughness was at a minimum when the OFF angle was 3°. Further, the numbers of projections having a width of 1 nm or greater of all the projections in the nanometer order in Samples 2 and 3 were respectively 130/200 nm² and 260/200 nm². Thus, the number in Sample 2 was much less than that in Sample 3. As clear from these figures, when the substrate having an OFF angle of about 0° was washed by a washing method under the conditions of the present invention, projections in the nanometer order extending parallel to <110> directions, which tend to be formed uniformly in either the [110] or [1-10] direction, were formed non-uniformly on the substrate.

In Samples 2 and 3, the axis of the work surface was inclined from the [001] direction to the OFF direction only of a <010> direction. However, the OFF direction is not limited only to a <010> direction. The effect of the present invention was obtained, basically when the OFF direction and OFF angle of the axis of the substrate were set so as to include a component having an inclination angle in a <010> direction. More specifically, to obtain the effect of the present invention, the range of the angle of an inclination from the [001] direction to a <010> direction was 1° to 5°, preferably 2° to 4°. When this condition was satisfied, even if the OFF direction and OFF angle of the axis of the substrate included a component having an inclination angle in a <010> direction, the effect of the present invention could be obtained. The allowable range of the angle of an inclination to the <110> direction was from 0° to 80°, preferably, from 0.1° to 10°.

Figure 9:
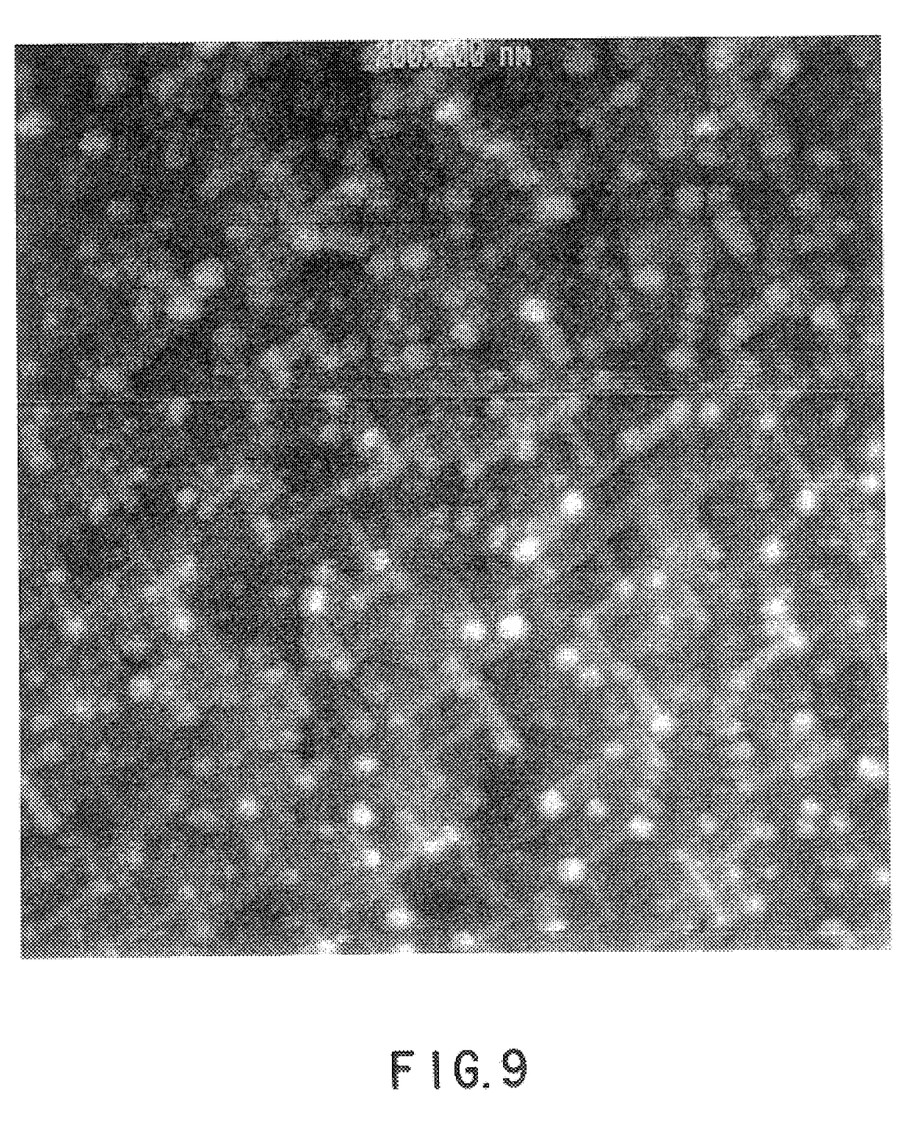
FIG. 9 is an STM photograph image of a surface of an Si substrate of Sample 4 processed by a comparative washing method.

FIG. 9 is an STM photograph image of a surface of an Si substrate of Sample 4 processed by a comparative washing method. In the substrate of Sample 4, the work surface was inclined 3° from the [001] direction only to a <110> direction. The substrate of Sample 4 was the same as those of Samples 1 to 3 in the other respects.

Sample 4 was washed under the same conditions as those in Samples 1 to 3 and observed by an STM. As shown in the photograph image of FIG. 9, the density of projections in the nanometer order of Sample 4 was not very different from that of Sample 1. The RMS of Sample 4 was 0.63 nm, which was substantially the same as that of Sample 1. Thus, the effect of roughness reduction was small. The results of the experiment prove that it is indispensable to select an OFF direction of the axis of the work surface in order to reduce roughness.

According to the present invention, when the crystal surface is washed with a washing liquid, it is possible to suppress an increase of roughness on the surface, which has been a problem in cleaning in the conventional process of manufacturing semiconductor devices. As a result, the crystal surface can be completely processed through a smaller number of steps as compared to the conventional art. Thus, the number of steps and the period of time required for the main process are reduced. Moreover, the process line itself is simplified, resulting in reduction of the number of pipes and apparatuses used in the process line. Consequently, the processing system can be operated at a lower cost, the device characteristics can be improved, and finally, the manufacturing cost of the semiconductor device can be reduced.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of preparing a semiconductor work surface, comprising:
    a forming step of forming a substrate having a semiconductor work surface which comprises a monocrystal and is designed to have an orientation off a (001) plane by a certain amount set such that an axis of said work surface has a component inclined with a first angle of from 1° to 5° from a [001] direction to a <010> direction;
    an etching step of using an etchant to etch and remove an oxide film formed on said work surface after said forming step; and
    a washing step of washing said work surface using a washing liquid having a property of etching said monocrystal, after said etching step.

2. The method according to claim 1, wherein said first angle is from 2° to 4°.

3. The method according to claim 1, wherein said axis of said work surface is set to have a component inclined with a second angle of from 0° to 80° from a [001] direction to a <010> direction.

4. The method according to claim 3, wherein said second angle is from 0.1° to 10°.

5. The method according to claim 1, said monocrystal is a face-centered cubic crystal.

6. The method according to claim 1, wherein said substrate as a whole is formed of said monocrystal.

7. The method according to claim 1, wherein said monocrystal consists essentially of one element or a combination of a plurality of elements selected from the group consisting of Si, Ge, C, B, N, Ga, As, In, P and Al.

8. The method according to claim 7, wherein said monocrystal consists essentially of Si.

9. The method according to claim 1, wherein said washing liquid has a property of etching said monocrystal such that a single or a plurality of surfaces, including a (111) plane, can be preferentially exposed.

10. The method according to claim 1, wherein said washing liquid consists essentially of one liquid or a combination of a plurality of liquids selected from the group consisting of pure water, $NH_4OH$, $NH_4F$, HF, HBr, HCl, $H_2O_2$, $H_2SO_4$, $HNO_3$, $O_3$ and a surfactant.

11. The method according to claim 10, wherein said washing liquid consists essentially of pure water.

12. The method according to claim 11, wherein said pure water serving as said washing liquid contains dissolved oxygen of a concentration of at most 500 ppb.

13. The method according to claim 12, wherein in said washing step, said washing liquid is set at a temperature of form 0° C. to 200° C. and brought into contact with said washing liquid for a period of time of from 1 second to a hundreds hours.

14. The method according to claim 1, wherein said washing step includes a step of forming a number of linear projections having a height of at most 1 nm on said work surface, and at least 60% of said linear projections extend parallel to a pair of [110] and [−110] directions or [110] and [1-10] directions, which are closer to a direction to which the axis of the surface is inclined from said [001] direction.

15. The method according to claim 1, wherein said orientation of said work surface is set such that at least one of density and size of projections of nanometer order, which are exposed on said work surface after said washing step, are decreased as compared to projections that result from a (001) plane of said monocrystal being washed by said washing liquid.

16. The method according to claim 15, wherein said projections are linear projections extending parallel to a <110> direction.

17. The method according to claim 1, further comprising, after said forming step and before said etching step, a step of positively forming said oxide film as a protecting film for protecting said work surface.

18. The method according to claim 1, wherein said etchant consists essentially of a compound etching solution containing fluorine atoms and hydrogen atoms.

19. A method of preparing a semiconductor work surface, comprising:

a forming step of forming a substrate having a semiconductor work surface which comprises a monocrystal and is designed to have an orientation such that an axis of said work surface is in a first direction having a vector component projected on a (100) or (010) plane and making a first angle of from 1° to 5° with a [001] direction;

an etching step of using an etchant to etch and remove an oxide film formed on said work surface after said forming step; and a washing step of washing said work surface using a washing liquid having a property of etching said monocrystal, after said etching step.

20. A method of preparing a semiconductor work surface, comprising:

a forming step of forming a substrate having a semiconductor work surface which comprises a monocrystal and is designed to have an orientation such that an axis of said work surface is in a $<x_1y_1z_1>$ direction, a $<0y_1z_1>$ or $<x_10z_1>$ direction making a first angle of from 1° to 5° with respect to a [001] direction;

an etching step of using an etchant to etch and remove an oxide film formed on said work surface after said forming step; and a washing step of washing said work surface using a washing liquid having a property of etching said monocrystal, after said etching step.

* * * * *

UNITED STATES PATENT AND TRADEMARK OFFICE
CERTIFICATE OF CORRECTION

PATENT NO. : 6,066,571
DATED : May 23, 2000
INVENTOR(S) : Koji USUDA et al.

It is certified that error appears in the above-identified patent and that said Letters Patent is hereby corrected as shown below:

Title Page, Item [57], in the Abstract, line 2, "monocrystaline" should read --monocrystalline--.

Claim 13, col. 12, line 56, "form 0°" should read --from 0°--.

Claim 13, col. 12, line 58, "hundreds" should read --hundred--.

Signed and Sealed this

Twenty-second Day of May, 2001

*Attest:*

NICHOLAS P. GODICI

*Attesting Officer*  Acting Director of the United States Patent and Trademark Office